(12) United States Patent
Sun

(10) Patent No.: US 7,473,498 B2
(45) Date of Patent: Jan. 6, 2009

(54) MASK AND METHOD OF MANUFACTURING A POLY-SILICON LAYER USING THE SAME

(75) Inventor: Ming-Wei Sun, Kaohsiung (TW)

(73) Assignee: Au Optronics Corp, Hsin-Chu (TW)

( * ) Notice: Subject to any disclaimer, the term of this patent is extended or adjusted under 35 U.S.C. 154(b) by 741 days.

(21) Appl. No.: 11/111,608

(22) Filed: Apr. 21, 2005

(65) Prior Publication Data

US 2006/0154154 A1    Jul. 13, 2006

(30) Foreign Application Priority Data

Jan. 7, 2005    (TW) ............................... 94100559 A

(51) Int. Cl.
*G03F 1/00* (2006.01)

(52) U.S. Cl. .......................................................... 430/5

(58) Field of Classification Search .................. 430/5, 430/322–324, 394; 716/19–21; 117/200–202
See application file for complete search history.

(56) References Cited

U.S. PATENT DOCUMENTS 6,326,286 B1    12/2001  Park et al. .................... 438/478
6,555,449 B1    4/2003   Im et al. ...................... 438/487
7,056,629 B2 *  6/2006   Crowder ......................... 430/5
2002/0179001 A1 12/2002  Jung ............................. 117/4
2003/0088848 A1 5/2003   Crowder ....................... 716/19

FOREIGN PATENT DOCUMENTS

WO    WO 03043093    5/2003

* cited by examiner

*Primary Examiner*—Stephen Rosasco
(74) *Attorney, Agent, or Firm*—Thomas, Kayden, Horstemeyer & Risley

(57) ABSTRACT

A mask and method of manufacturing a poly-silicon layer using the same are provided. The mask has a first, a second, a third, and a fourth region. The first region has first opaque portions and first slits. The second region has second slits and second opaque portions. The third region includes third opaque portions and third slits. The third opaque portions are perpendicular to or relatively slant to the first opaque portions. The fourth region includes fourth opaque portions and fourth slits. The fourth slits are parallel to the third opaque portions. The first, the second, the third and the fourth opaque portions respectively are parallel to and alternate with the first, the second, the third and the fourth slits, respectively. The method of manufacturing the poly-silicon layer includes forming an amorphous silicon layer on a substrate, then using a mask to form sequential lateral solidification.

22 Claims, 8 Drawing Sheets

MASK AND METHOD OF MANUFACTURING A POLY-SILICON LAYER USING THE SAME

This application claims the benefit of Taiwan application Ser. No. 94100559, filed Jan. 7, 2005, the subject matter of which is incorporated herein by reference.

BACKGROUND OF THE INVENTION

1. Field of the Invention

The invention relates in general to a mask and method of manufacturing a poly-silicon layer using the same, and more particularly to a mask and method of manufacturing a poly-silicon layer using the same applicable to the sequential lateral solidification technology.

2. Description of the Related Art

Along with the rapid advance in technology, planar display has been widely applied in portable electronic products such as notebook computer, personal digital assistant (PDA) and mobile phone. The Low-Temperature Poly-Silicon (LTPS) display panel uses a laser annealing method to transform an amorphous silicon (a-Si) layer into a poly-silicon layer, largely increasing the electron mobility of the thin film transistor (TFT). The design of the LTPS display panel, which integrates a panel driving circuit and an integrated circuit (IC) without using additional circuit boards, improves the flexibility in designing the panel and the circuit, and further brings greater potentials to the LTPS display panel. At present, the poly-silicon crystallization technology includes continuous grain silicon (CGS) technology, sequential lateral solidification (SLS) technology, CW-laser lateral crystallization (CLC) technology, selectively enlarging laser X'tallization (SELAX) technology, and so forth. The invention is exemplified by the sequential lateral solidification technology.

The sequential lateral solidification technology uses a mask equipped with a transparent region and an opaque portion to define a region of amorphous silicon layer on a substrate to be projected by the laser light. A part of the amorphous silicon layer corresponding to the transparent region is melted by the laser light and becomes a melted amorphous silicon layer, while the remaining part of the amorphous silicon layer corresponding to the opaque portion is not melted by the laser light. The temperature on the melted amorphous silicon is higher than the temperature on the remaining part of the amorphous silicon layer. The temperature gradient between the melted amorphous silicon and the remaining part of the amorphous silicon layer enables the melted amorphous silicon to crystallize lateral solidification and form a poly-silicon layer from the remaining part of the amorphous silicon layer towards the center of the melted amorphous silicon. Then, a substrate or a mask is moved so that the transparent region on the mask corresponds to a partial region on the remaining part of the poly-silicon layer, and that the above crystallization step is continued to perform the sequential lateral solidification. However, during the process of using the sequential lateral solidification technology to manufacture a poly-silicon layer, the sub-grain boundary is formed on the poly-silicon layer to reduce the inner strain generated by heat stress. Since the amount of sub-grain boundary is inversely proportional to electronic mobility, the occurrence of such boundary needs to be reduced so that the electronic mobility of the poly-silicon layer is improved.

Currently, there are a number of structural designs using mask area to reduce the amount of sub-grain boundary. For example, the structure of the mask applicable to the SLS technology and disclosed in United State Patent Application Publication No 2003/0088848 A1 is illustrated in FIG. 1. A mask 10 includes a mask body 11, and a first region 12, a second region 13, a third region 14 and a fourth region 15 formed in the mask body 11. The first region 12 has a number of first slits 12a and a number of first opaque portions 12b. The first slits 12a are parallel to and alternate with the first opaque portions 12b. The second region 13 has a number of second slits 13a and a number of second opaque portions 13b. The second slits 13a, which are parallel to and alternate with the second opaque portions 13b, are perpendicular to the first slits 12a. The third region 14 is positioned between the first region 12 and the second region 13, and has a number of third slits 14a and a number of third opaque portions 14b. The third slits 14a are parallel to and alternate with the third opaque portions 14b. The third slits 14a are parallel to the first slits 12a and correspond to the first opaque portions 12b. The width of the third slits 14a and that of the first slits 12a are respectively slightly larger than the width of the first opaque portions 12b and that of the third opaque portion 14b. The fourth region 15 is positioned between the second region 13 and the third region 14, and has a number of fourth slits 15a and a number of opaque portions 15b. The fourth slits 15a are parallel to and alternate with the fourth opaque portions 15b. The fourth slits 15a are parallel to the second slits 13a. The width of the second slits 13a and that of the fourth opaque portions 15a are respectively slightly larger than the width of the fourth opaque portions 15b and that of the second opaque portions 13b.

As shown in FIG. 2, the mask 10 respectively moves along several directions 17a~17d over every row on the amorphous silicon layer 16, so that every row on the amorphous silicon 16 is projected by the laser to crystallize a poly-silicon layer. Firstly, the mask 10 moves along the direction 17a when the first region 12 and the second region 13 are respectively the head and the tail. The laser light is projected onto the first row and that the sequential lateral solidification is performed to form poly-silicon. Next, the mask 10 moves along the direction 17b when the first region 12 and the second region 13 are respectively the tail and the head. The laser light is projected onto the second row, and that the sequential lateral solidification is performed to form poly-silicon. Then, the mask 10 is moved along the direction 17c, so that the laser light is projected onto the third row, and that the sequential lateral solidification is performed to form poly-silicon. Then, the mask 10 moves along the direction 17d, so that the laser light is projected onto the third row, and that the sequential lateral solidification is performed to form poly-silicon. Similarly, the mask 10 moves along an S-path to scan an amorphous silicon layer 16, so that every row on the amorphous silicon layer 16 is projected by the laser light to form poly-silicon crystallization. When the mask 10 moves along an S-path to scan the amorphous silicon layer 16, the extending direction of the first slits 12a and that of the third slits 14a are parallel to the directions 17a~17d, while the extending direction of the second slits 13a and that of the fourth slits 15a are perpendicular to the directions 17a~17d.

When the mask 10 scans the odd-numbered rows of the amorphous silicon layer 16, the laser projecting regions corresponding to the third slits 14a alternate and partially overlap with the crystallization regions corresponding to the first slits 12a. The laser projecting regions corresponding to the second slits 13a alternate and partially overlap with the crystallization regions corresponding to the fourth slits 15a. Therefore, the fourth region 15 and the second region 13 are used to eliminate the sub-grain boundaries caused by the first region 12 and the third region 14. The third region 14 is used to melt and crystallize the corresponding non-crystallization region corresponding to the first region 12. The second region 13 is used to melt and crystallize the corresponding non-crystallization region corresponding to the fourth region 15.

Similarly, when the mask 10 scans the even-numbered row of the amorphous silicon layer 16, the laser projecting regions corresponding to the first slits 12a alternate and partially overlap with the corresponding crystallization regions of the third slits 14a. The laser projecting regions corresponding to the fourth slits 15a alternate and partially overlap with the crystallization regions corresponding to the second slits 13a. Therefore, the first region 12 and the third region 14 are used to eliminate the sub-grain boundary caused by the fourth region 15 and the second region 13. The first region 12 is used to melt and crystallize the corresponding non-crystallization region corresponding to the third region 14. The fourth region 15 is used to melt and crystallize the corresponding non-crystallization region corresponding to the second region 13.

When the mask 10 moves along an S-path to scan amorphous silicon layer 16, the first slits 12a is perpendicular to the second slits 13a, causing the poly-silicon grain direction and the grain boundary direction formed on the crystallization of the odd-numbered rows of the amorphous silicon layer 16 to be respectively different with that on the crystallization of the even-numbered rows of the amorphous silicon layer 16, largely affecting the electricity of the thin film transistor completed in subsequent manufacturing process.

The above problem of the grain direction and the boundary direction being different can be resolved if the scan direction of the mask 10 is changed to be fixed. For example, the mask 10 of FIG. 2 scans every row of the amorphous silicon layer 16 along the direction 17a from left to right. However, a longer manufacturing time is required.

SUMMARY OF THE INVENTION

It is therefore an object of the invention to provide a mask and a method of manufacturing a poly-silicon layer using the same. Of the mask applied in the sequential lateral solidification technology, the slits on the first and the last regions are designed to be mutually parallel and partially overlapping, while the slits on the middle two regions are mutually parallel and partially overlapping but are mutually perpendicular or relatively slant to an angle to the slits on the first and the last regions. Consequently, the sub-grain boundary of the poly-silicon that the amorphous silicon crystallizes according to the sequential lateral solidification technology is reduced, the evenness along the crystallization direction of the poly-silicon is improved, the coarseness on the surface of the poly-silicon layer is reduced, and the electricity and evenness on the thin film transistor completed in subsequent manufacturing process is largely improved.

According to an object of the invention a mask including a first region, a second region, a third region and a fourth region is provided. The first region and the second region are respectively formed in the two ends of the mask and respectively have a number of first slits and a number of second slits. The first slits and the second slits are substantially parallel to each other and extend towards a first direction. The third region and the fourth region are respectively formed between the first region and the second region and respectively have a number of third slits and a number of fourth slits. The third slits and the fourth slits are substantially parallel to each other and extend towards a second direction.

According to yet another object of the invention, a method of manufacturing a poly-silicon layer is provided. Firstly, an amorphous silicon layer is formed on a substrate. Then, a mask including a first region, a second region, a third region and a fourth region is provided. The first region and the second region are respectively formed in the two ends of the mask and respectively have a number of first slits and a number of second slits. The first silts and the second slits are substantially parallel to each other and extend towards a first direction. The third region and the fourth region are respectively formed between the first region and the second region and respectively have a number of third slits and a number of fourth slits. The third slits and the fourth slits are substantially parallel to each other and extend towards a second direction. Lastly, a laser is provided to project laser light onto the substrate via the mask.

Other objects, features, and advantages of the invention will become apparent from the following detailed description of the preferred but non-limiting embodiments. The following description is made with reference to the accompanying drawings.

DETAILED DESCRIPTION OF THE INVENTION

First Embodiment

Figure 1:
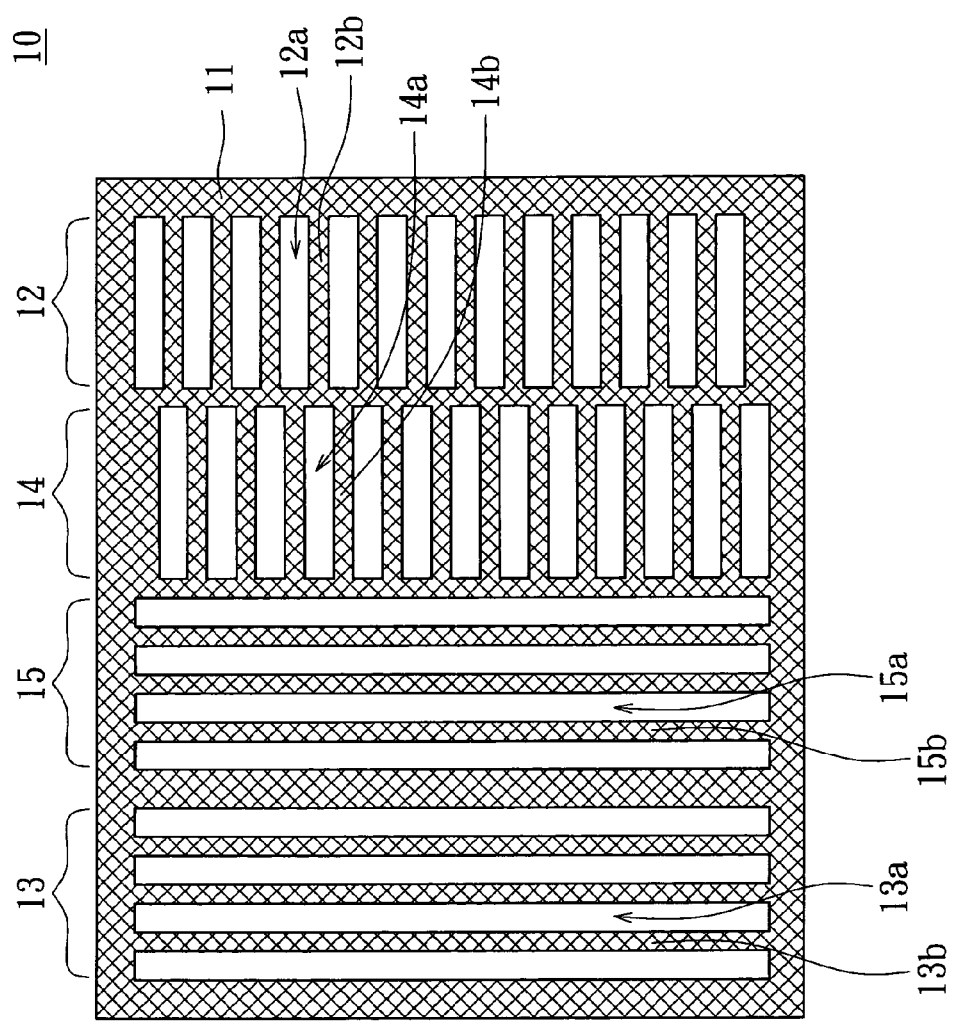
FIG. 1 (Related Art) is a diagram of a mask applied in sequential lateral solidification technology and disclosed in United State Patent Application Publication No. 2003/0088848 A1.
Figure 2:
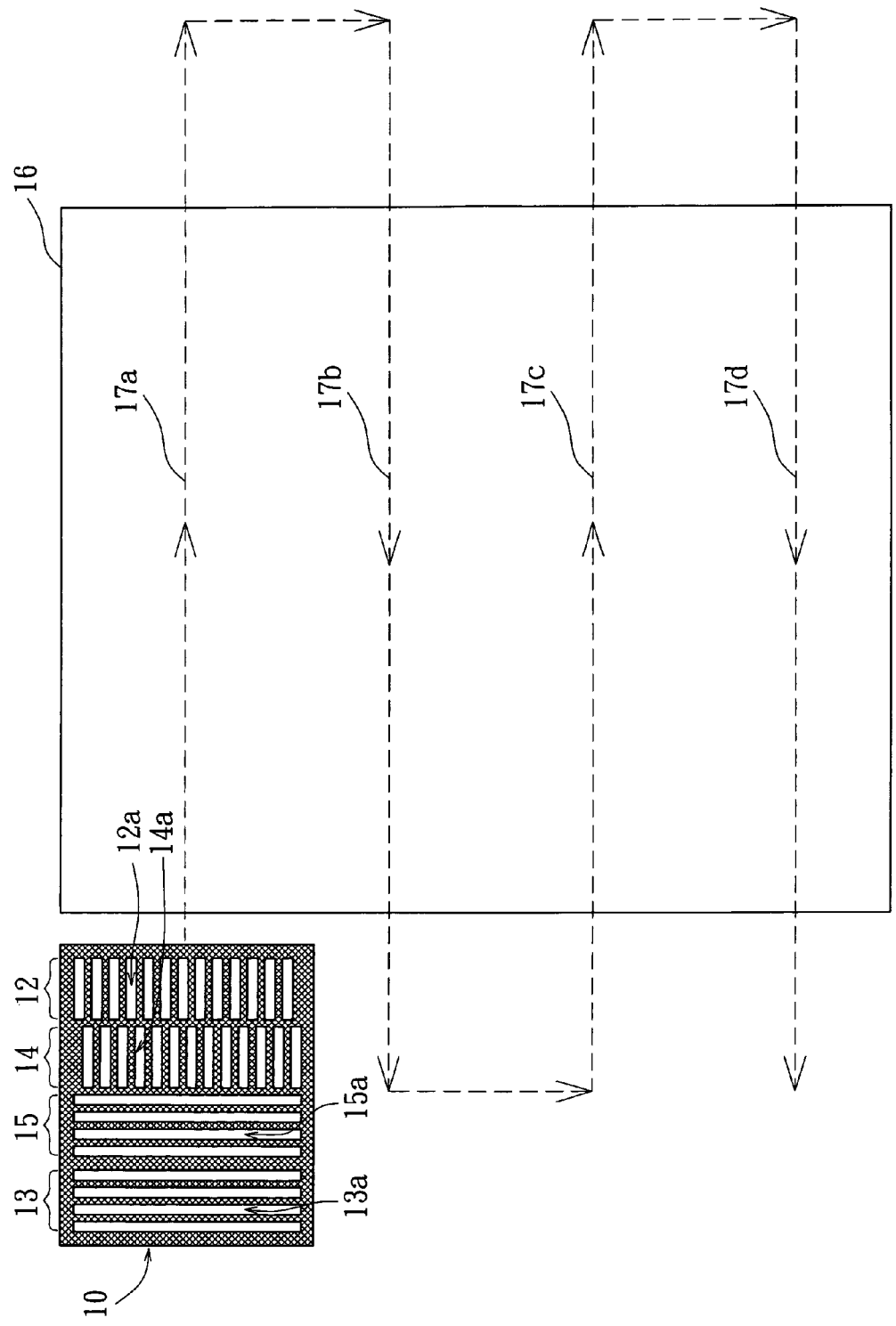
FIG. 2 (Related Art) is a diagram showing the state when the mask of FIG. 1 moves along an S-path to scan amorphous silicon layer.
Figure 3:
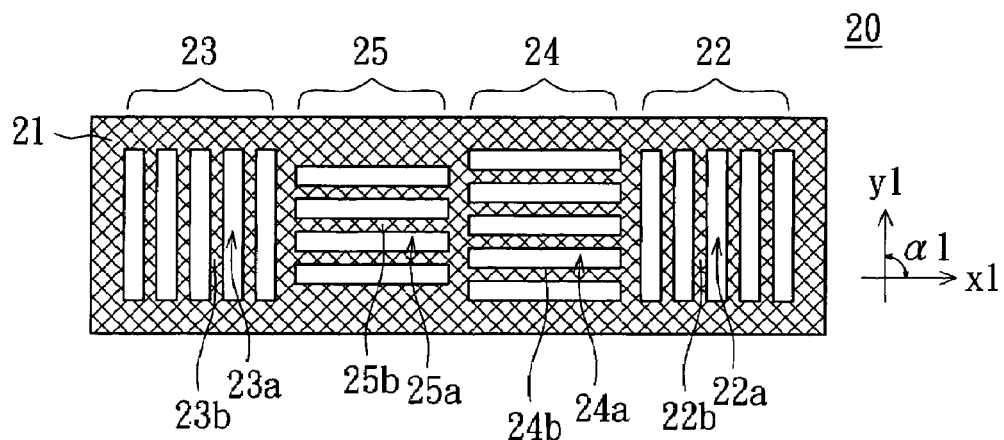
FIG. 3 is a diagram of a mask according to a first embodiment of the invention.
Figure 4:
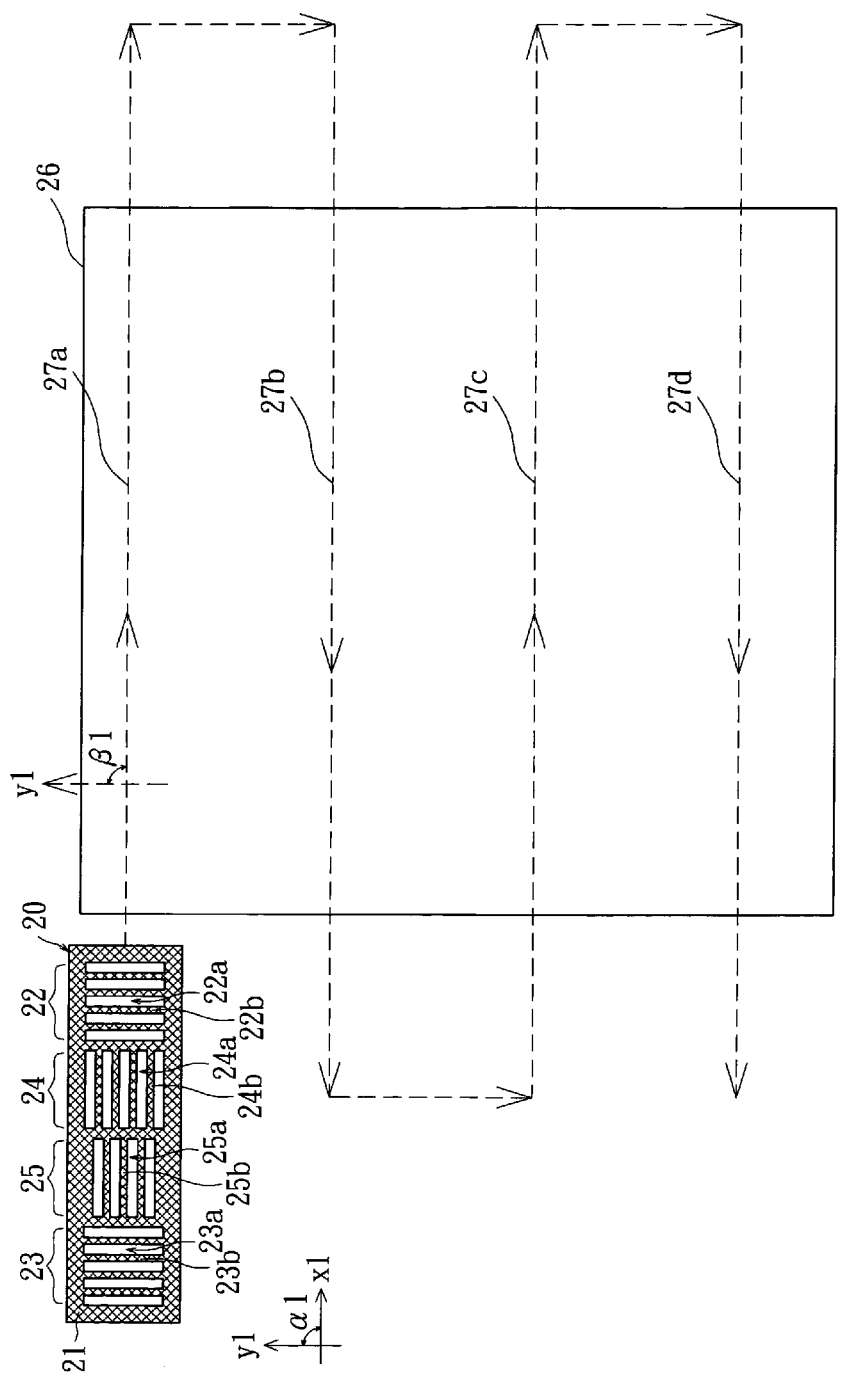
FIG. 4 is a diagram showing the state when the mask of FIG. 3 moves along an S-path to scan amorphous silicon layer.

Referring to both FIGS. 3~4, FIG. 3 is a diagram of a mask according to a first embodiment of the invention, while FIG. 4 is a diagram showing the state when the mask of FIG. 3 moves along an S-path to scan an amorphous silicon layer. In FIGS. 3~4, a mask 20 includes a mask body 21, a first region 22, a second region 23, a third region 24 and a fourth region 25. The first region 22, the second region 23, the third region 24 and the fourth region 25 are formed in the mask body 21. The first region 22 and the second region 23 are respectively formed in the two ends of the mask 20, and have a number of first slits and a number of second slits. The first slits and the second slits are substantially parallel to each other and extend towards a first direction. The third region 24 and the fourth region 25 are respectively formed between the first region 22 and the second region 23, and have a number of third slits and a number of fourth slits. The third slits and the fourth slits are substantially parallel to each other and extend towards a second direction. As for the detailed structure of the mask 20 is elaborated below.

The first region 22 has a number of first slits 22a and a number of first opaque portions 22b. The first slits 22a are parallel to and alternate with the first opaque portions 22b. The second region 23 has a number of second slits 23a and a number of second opaque portions 23b. The second slits 23a are parallel to and alternate with the second opaque portions 23b. The second slits 23a are parallel to the first slits 22a. Besides, the width of the first slits 22a and that of the second slits 23a are respectively slightly larger than the width of the second opaque portions 23b and that of the first opaque portions 22b.

The third region 24 is positioned between the first region 22 and the second region 23, and has a number of third slits 24a and a number of third opaque portions 24b. The third slits 24a are parallel to and alternate with the third opaque portions 24b. The third slits 24a are perpendicular or relatively slant to the first slits 22a. The extending direction of the third slits 24a and that of the first slits 22a respectively are x1 and y1 with a first included angle α1 existing between x1 and y1. In the present embodiment, the first included angle α1 is 90°, denoting that the third slits 24a is perpendicular to the first slits 22a. The fourth region 25 is positioned between the second region 23 and the third region 24, and has a number of fourth slits 25a and a number of fourth opaque portions 25b. The fourth slits 25a are parallel to and alternate with the fourth opaque portions 25b. The fourth slits 25a are parallel to the third slits 24a. The fourth slits 25a and the third slits 24a respectively correspond to the third opaque portions 24b and the fourth opaque portions 25b. The width of the fourth slits 25a and that of the third slits 24a are respectively slightly larger than the width of the third opaque portions 24b and that of the fourth opaque portions 25b. As for the process of using the mask 20 to crystallize a poly-silicon layer is elaborated below.

As shown in FIG. 4, firstly, an amorphous silicon layer 26 is formed on a substrate. Next, a mask 20 is provided. Then, a laser is provided and projected onto the amorphous silicon layer 26 on a substrate via the mask 20. The mask 20 moves over the amorphous silicon layer 26 on the substrate or the substrate moves under the mask 20 for the laser to be projected onto every row of the amorphous silicon layer 26 to form poly-silicon via the mask 20. Therefore, the present embodiment performs sequential lateral solidification to crystallize a poly-silicon layer by moving the mask 20 against the amorphous silicon layer. In the present embodiment, if the amorphous silicon layer 26 is fixed, the mask 20 moves over every row of the amorphous silicon layer 26 along several directions 27a~27d respectively for the laser to be projected every row of the amorphous silicon 26 to crystallize a poly-silicon layer. Firstly, the mask 20, respectively using the first region 22 and the second region 23 as the head and the tail, moves along the direction 27a for the laser to be projected onto the first row and perform sequential lateral solidification to crystallize a poly-silicon layer. A second included angle β1 is included between the extending direction y1 of the first slits 22a and the direction 27a. In the present embodiment, the second included angle β1 is 90°, denoting that the extending direction y1 of the first slits 22a is perpendicular to the direction 27a. Then, the mask 20, respectively using the second region 23 and the first region 22 as the head and the tail, moves along the direction 27b for the laser to be projected onto the second row and perform sequential lateral solidification to crystallize a poly-silicon layer. Next, the mask 20 moves along the direction 27c for the laser to be projected onto the third row and perform sequential lateral solidification to crystallize a poly-silicon layer. Then, the mask 20 moves along the direction 27d for the laser to be projected onto the third row and perform sequential lateral solidification to crystallize a poly-silicon layer. Similarly, the mask 20 moves along an S-path to scan amorphous silicon layer 26 for the laser to be projected onto the fourth row and perform sequential lateral solidification to crystallize a poly-silicon layer.

When the mask 20 moves along an S-path to scan amorphous silicon layer 26, the extending direction of the first slits 22a and that of the second slits 23a are perpendicular to the directions 27a~27d, while the extending direction of the third slits 24a and that of the fourth slits 25a are parallel to the direction 27a~27d. In one embodiment, the extending direction of the first slits 22a and that of the second slits 23a are parallel to the directions 27a~27d, while the extending direction of the third slits 24a and that of the fourth slits 25a are perpendicular to the direction 27a~27d.

When the mask 20 scans the odd-numbered rows of the amorphous silicon layer 26, the laser projecting region corresponding to the fourth slits 25a alternate and partially overlap with the crystallization regions corresponding to the third slits 24a. The laser projecting regions corresponding to the second slits 23a alternate and partially overlap with the crystallization regions corresponding to the first slits 22a.

Similarly, when the mask 20 scans the even-numbered row of the amorphous silicon layer 26, the laser projecting regions corresponding to the third slits 24a alternate and partially overlap with the crystallization regions corresponding to the fourth slits 25a. The laser projecting regions corresponding to the first slits 22a alternate and partially overlap with the crystallization regions corresponding to the second slits 23a.

When the mask 20 moves along an S-path to scan the amorphous silicon layer 26, the first slits 22a are parallel to the second slits 23a, causing the poly-silicon grain direction and the grain boundary direction formed on the crystallization of the odd-numbered rows of the amorphous silicon layer 26 to be respectively the same with that on the crystallization of the even-numbered rows of the amorphous silicon layer 26, resulting in a poly-silicon layer with better evenness of crystallization than that obtained according to a conventional sequential lateral solidification technology.

According to the present embodiment, the slits on the first and the last areas on the mask are designed to be mutually parallel and partially overlapping, and the slits on the middle two areas are mutually parallel and partially overlapping but are mutually perpendicular or relatively slant to an angle to the slits on the first and the last areas. Consequently, the sub-grain boundary of the poly-silicon that the amorphous silicon crystallizes according to the sequential lateral solidification technology is reduced, the evenness along the crystallization direction of the poly-silicon is improved, the coarseness on the surface of the poly-silicon layer is reduced, and the electricity and evenness on the thin film transistor completed in subsequent manufacturing process is largely improved.

Anyone who is skilled in the technology will understand that the technology of the present embodiment is not limited thereto. For example, the number and layout of the region can be augmented, such design of mask avoids the grain direction and the grain boundary of the poly-silicon corresponding to the odd-numbered rows of the amorphous silicon layer by the laser to be different with that of the poly-silicon crystallized corresponding to rows of the even-numbered rows of the amorphous silicon layer by the laser.

Figure 5:
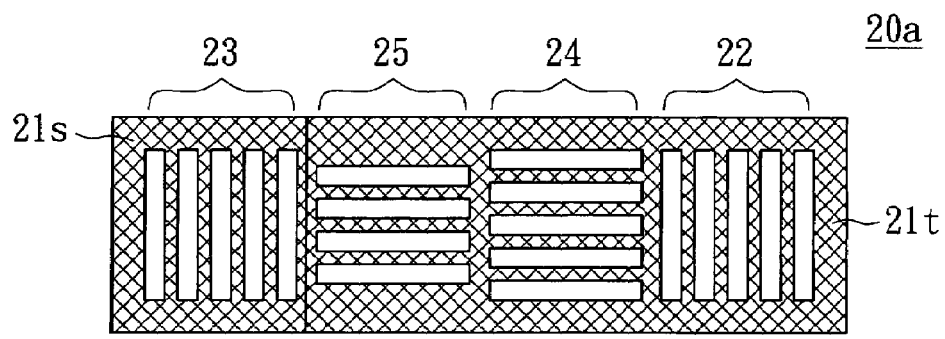
FIGS. 5~11 are variations of the mask of FIG. 1.
Figure 6:
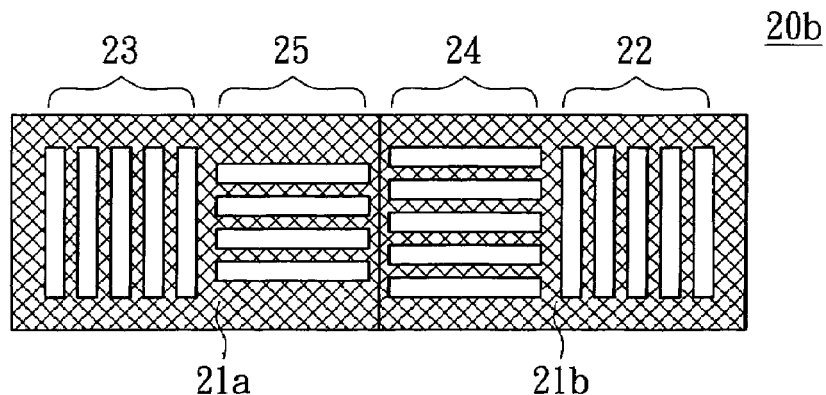
Figure 7:
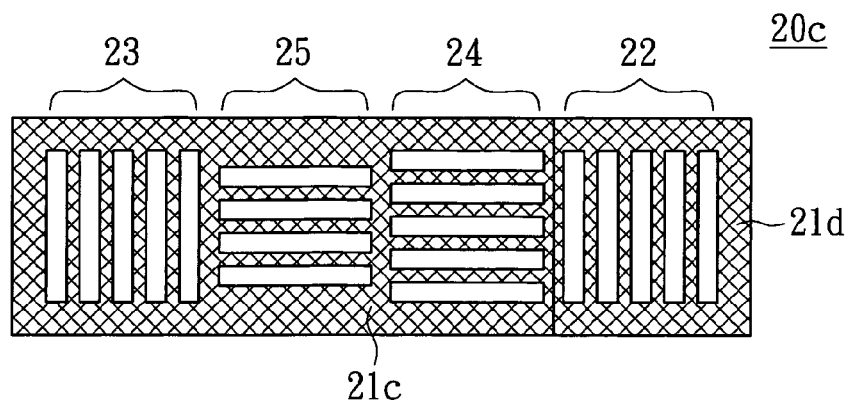

Besides, the first region 22, the second region 23, the third region 24 and the fourth region 25 can be formed in two mask bodies and are illustrated in accompanied drawings below. As shown in FIG. 5, a mask 20a further includes two mask bodies 21s and 21t. The second region 23 is formed in the mask body 21s, while the first region 22, the third region 24 and the fourth region 25 are formed in the mask body 21t. Or as shown in FIG. 6, a mask 20b includes two mask bodies 21a and 21b. The second region 23 and the fourth region 25 are formed in the mask body 21a, while the first region 22 and the third region 24 are formed in the mask body 21b. Or as shown in FIG. 7, a mask 20c includes two mask bodies 21c and 21d. The second region 23, the third region 24 and the fourth region 25 are formed in the mask body 21c, while the first region 22 is formed in the mask body 21d.

Figure 8:
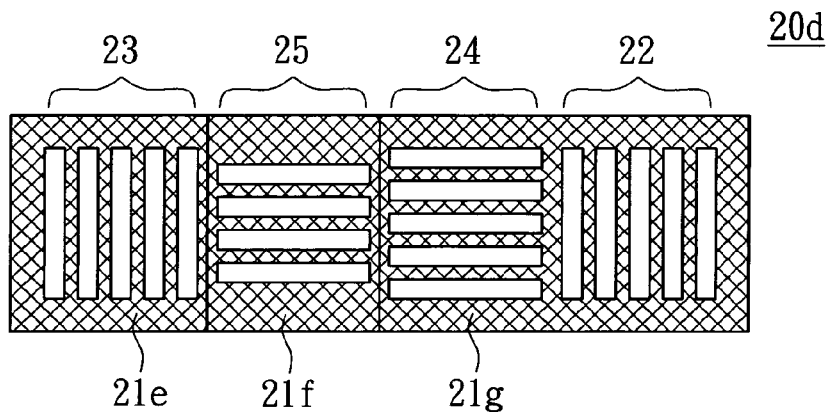
Figure 9:
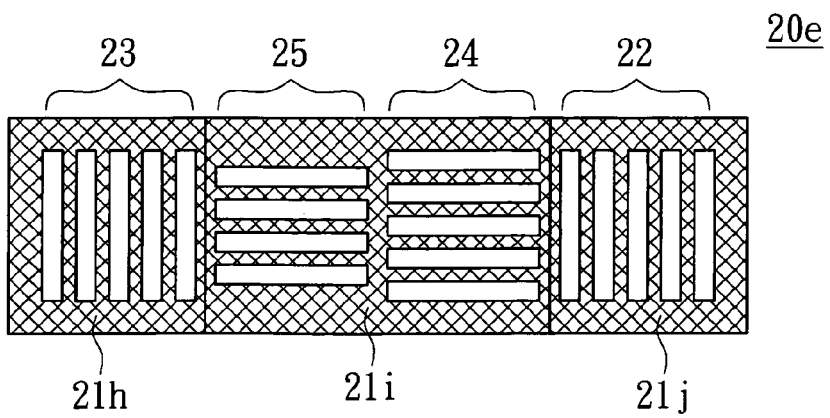
Figure 10:
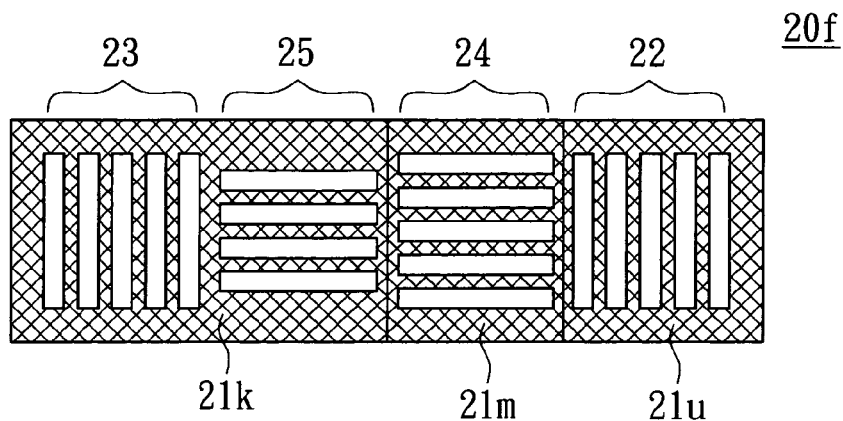

Furthermore, the first region 22, the second region 23, the third region 24 and the fourth region 25 can be formed in three mask bodies and are illustrated in accompanied drawings below. As shown in FIG. 8, a mask 20d includes three mask bodies 21e, 21f and 21g. The second region 23 is formed in the mask body 21e, the fourth region 25 is formed in the mask body 21f, while the first region 22 and the third region 24 are formed in the mask body 21g. Or as shown in FIG. 9, a mask 20e includes three mask bodies 21h, 21i and 21j. The second region 23 is formed in the mask body 21i, the fourth region 25 and the third region 24 are formed in the mask body 21i, while the first region 22 is formed in the mask body 21j. Or as shown in FIG. 10, a mask 20f includes three mask bodies 21k, 21m and 21u. The second region 23 and the fourth region 25 are formed in the mask body 21k, the third region 24 is formed in the mask body 21m, while the first region 22 is formed in the mask body 21u.

Figure 11:
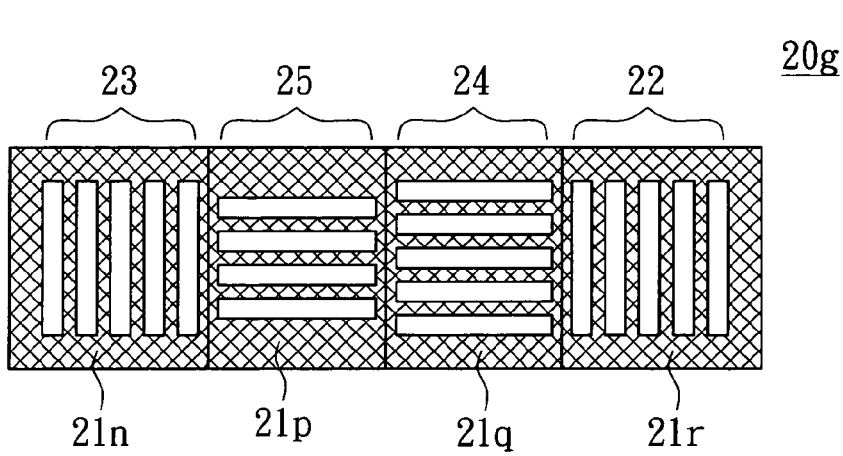

Moreover, the first region 22, the second region 23, the third region 24 and the fourth region 25 can also be formed in four mask bodies and are illustrated in accompanied drawings below. As shown in FIG. 11, a mask 20g includes four mask bodies 21n, 21p, 21q and 21r. The second region 23, the fourth region 25, the third region 24 and the first region 22 are respectively formed in the mask bodies 21n, 21p, 21q and 21r.

When the above mask is used in sequential lateral solidification technology, suppose the width of every region is the same, the above mask can step a half or multiples of the width of the amorphous silicon layer towards the substrate for the amorphous silicon region projected by the laser light to be fully melted and crystallized as a poly-silicon layer or to recrystallize the poly-silicon layer.

Second Embodiment

Figure 12:
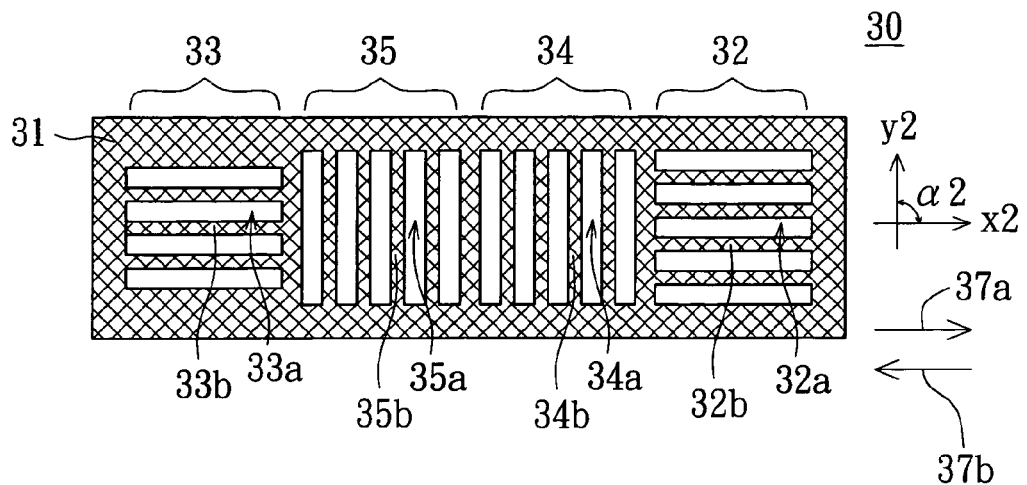
FIG. 12 is a diagram of a mask according to a second embodiment of the invention.

Referring to FIG. 12, a diagram of a mask according to a second embodiment of the invention is shown. In FIG. 12, a mask 30 includes a mask body 31, a first region 32, a second region 33, a third region 34 and a fourth region 35. The first region 32, the second region 33, the third region 34 and the fourth region 35 are formed in the mask body 31. The first region 32 has a number of first slits 32a and a number of first opaque portions 32b. The first slits 32a are parallel to and alternate with the first opaque portions 32b. The second region 33 has a number of second slits 33a and a number of second opaque portions 33b. The second slits 33a are parallel to and alternate with the second opaque portions 33b. The second slits 33a are parallel to the first slits 32a. The first slits 32a and the second slits 33a respectively correspond to the second opaque portions 33b and the first opaque portions 32b. The width of the first slits 32a and that of the second slits 33a are respectively slightly larger than the width of the second opaque portions 33b and that of the first opaque portions 32b.

The third region 34 is positioned between the first region 32 and the second region 33, and has a number of third slits 34a and a number of third opaque portions 34b. The third slits 34a are parallel to and alternate with the third opaque portions 34b. The third slits 34a are perpendicular or relatively slant to the first slits 32a. The extending direction of the third slits 34a and that of the first slits 32a respectively are y2 and x2 with a first included angle α2 existing between y2 and x2. In the present embodiment, the first included angle α2 is 90°, denoting that the third slits 34a are perpendicular to the first slits 32a. The fourth region 35 is positioned between the second region 33 and the third region 34, and has a number of fourth slits 35a and a number of fourth opaque portions 35b. The fourth slits 35a are parallel to and alternate with the fourth opaque portions 35b. The fourth slits 35a are parallel to the third slits 34a. The width of the fourth slits 35a and that of the third slits 34a are respectively slightly larger than the width of the third opaque portions 34b and that of the fourth opaque portions 35b.

The mask 30 moves over the amorphous silicon layer on the substrate or the substrate moves under the mask 30 for the laser to crystallize every row of the amorphous silicon layer to form poly-silicon via the mask 30. In the present embodiment, suppose the mask 30 scans the odd-numbered rows of the amorphous silicon layer along the direction 37a, the laser projecting regions corresponding to the fourth slits 35a alternate and partially overlap with the crystallization regions corresponding to the third slits 34a. The laser projecting regions corresponding to the second slits 33a alternate and partially overlap with the crystallization regions corresponding to the first slits 32a. When the mask 30 scans the even-numbered rows of the amorphous silicon layer along the direction 37b, the laser projecting regions corresponding to the third slits 34a alternate and partially overlap with the crystallization regions corresponding to the fourth slits 35a. The laser projecting regions corresponding to the first slits 32a alternate and partially overlap with the crystallization regions corresponding to the second slits 33a. When the mask 30 scans the amorphous silicon layer along directions 37a and 37b respectively, the extending direction of the first slits 32a and that of the second slits 33a are parallel to or perpendicular to the directions 37a and 37b, while the extending direction of the third slits 34a and that of the fourth slits 35a are parallel to or perpendicular to the directions 37a and 37b. In the present embodiment, the extending direction x2 of the first slits 32a is parallel to the direction 37a, so the second included angle between the extending direction x2 of the first slits 32a and the direction 37a is 0° or 180°.

When the mask 30 moves along an S-path to scan the amorphous silicon layer, the first slits 32a is parallel to the second slits 33a, causing the poly-silicon grain direction and grain boundary direction formed on the crystallization of the odd-numbered rows of the amorphous silicon layer 26 to be respectively the same with that on the crystallization of the odd-numbered rows of the amorphous silicon layer 26, resulting in a poly-silicon layer with better evenness of crystallization than that obtained according to a conventional sequential lateral solidification technology.

However, anyone who is skilled with the technology of the present embodiment will understand that the technology of the invention is not limited thereto. For example, the mask with the number and layout of the above areas being augmented avoids the grain direction and the grain boundary direction of the poly-silicon corresponding to the odd-numbered rows of the amorphous silicon layer by the laser to be respectively different with that of the poly-silicon corresponding to the even-numbered rows of the amorphous silicon layer by the laser. Besides, the first region 32, the second region 33, the third region 34 and the fourth region 35 can be formed in two, three or four mask bodies. When the above mask is used in sequential lateral solidification technology, suppose the width of every area is the same, the above mask can step a half or multiples of the width of the amorphous silicon layer towards the substrate for the amorphous silicon area projected by the laser light to be fully melted and crystallized as a poly-silicon layer or to recrystallize the poly-silicon layer.

Third Embodiment

Figure 13:
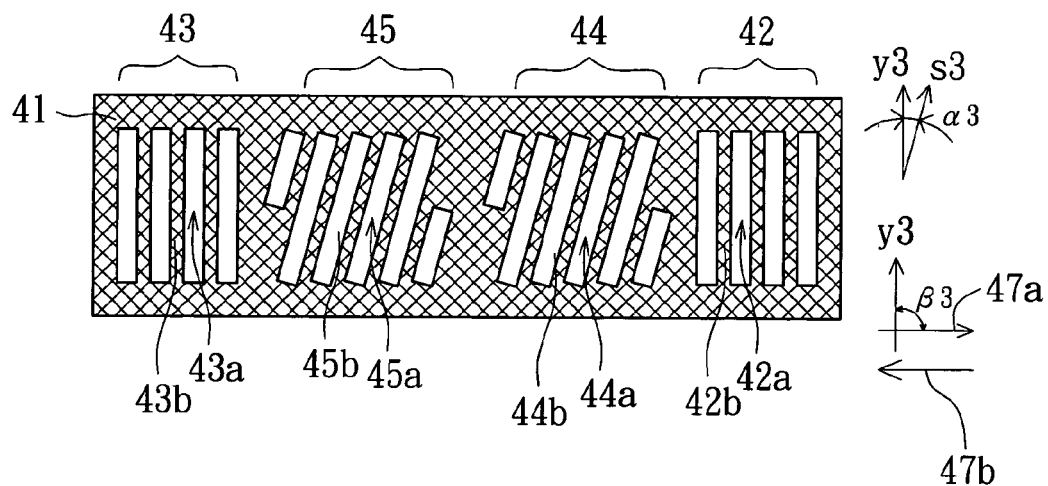
FIG. 13 is a diagram of a mask according to a third embodiment of the invention.

Referring to FIG. 13, a diagram of a mask according to a third embodiment of the invention is shown. In FIG. 13, a mask 40 includes a mask body 41, a first region 42, a second region 43, a third region 44 and a fourth region 45. The first region 42, the second region 43, the third region 44 and the fourth region 45 are formed in the mask body 41. The first region 42 has a number of first slits 42a and a number of first opaque portions 42b. The first slits 42a are parallel to and alternate with the first opaque portions 42b. The second region 43 has a number of second slits 43a and a number of second opaque portions 43b. The second slits 43a are parallel to and alternate with the second opaque portions 43b, while the second slits 43a are parallel to the first slits 42a. The first slits 42a and the second slits 43a respectively correspond to the second opaque portions 43b and the first opaque portions 42b. The width of the first slits 42a and that of the second slits 43a are respectively slightly larger than the second opaque portions 43b and that of the first opaque portions 42b.

The third region 44 is positioned between the first region 42 and the second region 43, and has a number of third slits 44a and a number of third opaque portions 44b. The third slits 44a are parallel to and alternate with the third opaque portions 44b, while the third slits 44a are relatively slant to the first slits 42a.

The extending direction of the third slits 44a and that of the first slits 42a respectively are y3 and s3 with a first included angle α3 existing between y3 and s3. In the present embodiment, the first included angle α3 is smaller than 90° but larger than 0°, denoting that the third slits 44a are relatively slant to the first slits 42a.

The fourth region 45 is positioned between the second region 43 and the third region 44, and has a number of fourth slits 45a and a number of fourth opaque portions 45b. The fourth slits 45a are parallel to and alternate with the fourth opaque portions 45b. The fourth slits 45a are parallel to the third slits 44a. The width of the fourth slits 45a and that of the third slits 44a are respectively slightly larger than the width of the third opaque portions 44b and that of the fourth opaque portions 45b.

The mask 40 moves over the amorphous silicon layer on the substrate for the laser to crystallize every row of the amorphous silicon layer to form poly-silicon via the mask 40. In the present embodiment, suppose the mask 40 scans the odd-numbered rows of the amorphous silicon layer along a direction 47a, the laser projecting regions corresponding to the fourth slits 45a alternate and partially overlap with the crystallization regions corresponding to the third slits 44a. The laser projecting regions corresponding to the second slits 43a alternate and partially overlap with the crystallization regions corresponding to the first slits 42a.

The extending direction y3 of the first slits 42a and the direction 47a have a second included angle β3. In the present embodiment, the second included angle β3 is 90°, denoting that the extending direction y3 of the first slits 42a is perpendicular to the direction 47a.

When the mask 40 scans the even-numbered rows of the amorphous silicon layer along the direction 47b, the laser projecting regions corresponding to the third slits 44a alternate and partially overlap with the crystallization regions corresponding to the fourth slits 45a. The laser projecting regions corresponding to the first slits 42a alternate and partially overlap with the crystallization regions corresponding to the second slits 43a.

When the mask 40 scans the amorphous silicon layer along the directions 47a and 47b respectively, the extending direction of the first slits 42a and that of the second slits 43a are perpendicular to the directions 47a and 47b, while the extending direction of the third slits 44a and that of the fourth slits 45a are relatively slant to the directions 47a and 47b.

Fourth Embodiment

Figure 14:
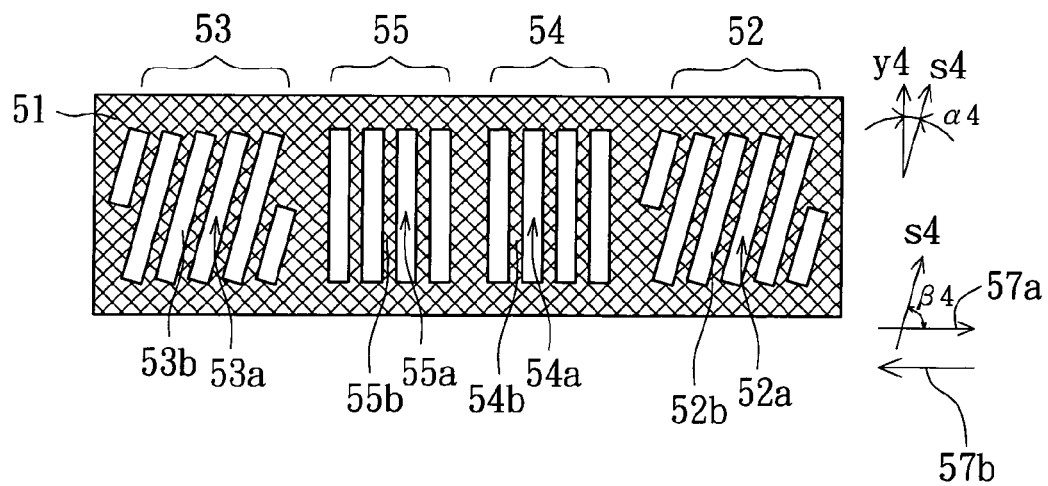
FIG. 14 is a diagram of a mask according to a fourth embodiment of the invention.

Referring to FIG. 14, a diagram of a mask according to a fourth embodiment of the invention is shown. In FIG. 14, a mask 50 includes a mask body 51, a first region 52, a second region 53, a third region 54 and a fourth region 55. The first region 52, the second region 53, the third region 54 and the fourth region 55 are formed in the mask body 51. The first region 52 has a number of first slits 52a and a number of first opaque portions 52b. The first slits 52a are parallel to and alternate with the first opaque portions 52b. The second region 53 has a number of second slits 53a and a number of second opaque portions 53b. The second slits 53a are parallel to and alternate with the second opaque portions 53b, while the second slits 53a are parallel to the first slits 52a. The first slits 52a and the second slits 53a respectively correspond to the second opaque portions 53b and the first opaque portions 52b, while the width of the first slits 52a and that of the second slits 53a are respectively slightly larger than the width of the second opaque portions 53b and that of the first opaque portions 52b.

The third region 54 is positioned between the first region 52 and the second region 53, and has a number of third slits 54a and a number of third opaque portions 54b. The third slits 54a are parallel to and alternate with the third opaque portions 54b, while the third slits 54a are relatively slant to the first slits 52a.

The extending direction of the third slits 54a and that of the first slits 52a respectively are s4 and y4 with a first included angle α4 existing between s4 and y4. In the present embodiment, the first included angle α4 is smaller than 90° but larger than 0°, denoting that the third slits 54a are relatively slant to the first slits 52a.

The fourth region 55 is positioned between the second region 53 and the third region 54, and has a number of fourth slits 55a and a number of fourth opaque portions 55b. The fourth slits 55a are parallel to and alternate with the fourth opaque portions 55b. The fourth slits 55a are parallel to the third slits 54a, while the width of the fourth slits 55a and that of the third slits 54a are respectively slightly larger than the width of the third opaque portions 54b and that of the fourth opaque portions 55b.

The mask 50 moves over the amorphous silicon layer on the substrate for the laser to crystallize every row of the amorphous silicon layer to form poly-silicon via the mask 50. In the present embodiment, suppose the mask 50 scans the odd-numbered rows of the amorphous silicon layer along the direction 57a, the laser projecting regions corresponding to the fourth slits 55a alternate and partially overlap with the crystallization regions corresponding to the third slits 54a. The laser projecting regions corresponding to the second slits 53a alternate and partially overlap with the crystallization regions corresponding to the first slits 52a.

The extending direction s4 of the first slits 52a and the direction 57a has a second included angle β4. In the present embodiment, the second included angle β4 is smaller than 90° but larger than 0°, denoting that the extending direction s4 of the first slits 52a is slant to the direction 57a.

When the mask 50 scans the even-numbered rows of the amorphous silicon layer along the direction 57b, the laser projecting regions corresponding to the third slits 54a alternate and partially overlap with the crystallization regions corresponding to the fourth slits 55a. The laser projecting regions corresponding to the first slits 52a alternate and partially overlap with the crystallization regions of the second slits 53a.

When the mask 50 scans the amorphous silicon layer along the directions 57a and 57b respectively, the extending direction of the first slits 52a and that of the second slits 53a are relatively slant to the directions 57a and 57b, while the extending direction of the third slits 54a and that of the fourth slits 55a are perpendicular to the directions 57a and 57b.

Fifth Embodiment

Figure 15:
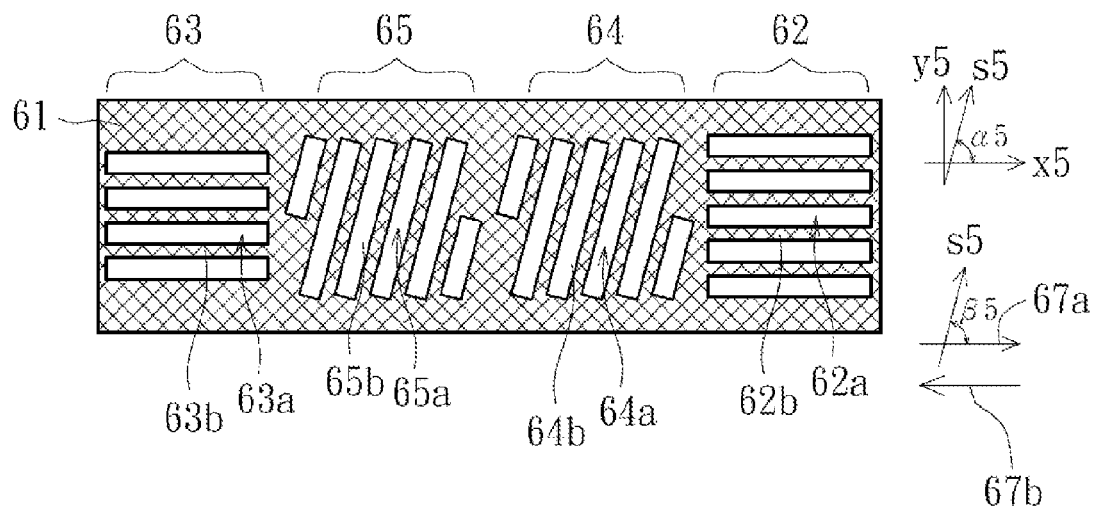
FIG. 15 is a diagram of a mask according to a fifth embodiment of the invention.

Referring to FIG. 15, a diagram of a mask according to a fifth embodiment of the invention is shown. In FIG. 15, a mask 60 includes a mask body 61, a first region 62, a second region 63, a third region 64 and a fourth region 65. The first region 62, the second region 63, the third region 64 and the fourth region 65 are formed in the mask body 61. The first region 62 has a number of first slits 62a and a number of first opaque portions 62b. The first slits 62a are parallel to and alternate with the first opaque portions 62b. The second region 63 has a number of second slits 63a and a number of second opaque portions 63b. The second slits 63a are parallel to and alternate with the second opaque portions 63b, while the second slits 63a are parallel to the first slits 62a. The first slits 62a and the second slits 63a respectively correspond to the second opaque portions 63b and the first opaque portions 62b. The width of the first slits 62a and that of the second slits 63a are respectively slightly larger than the width of the second opaque portions 63b and that of the first opaque portions 62b.

The third region 64 is positioned between the first region 62 and the second region 63, and has a number of third slits 64a and a number of third opaque portions 64b. The third slits 64a are parallel to and alternate with the third opaque portions 64b, while the third slits 64a are relatively slant to the first slits 62a.

The extending direction of the third slits 64a and that of the first slits 62a respectively are s5 and x5 with a first included angle between s5 and x5 being equal to α5. In the present embodiment, the first included angle α5 is smaller than 90° but larger than 0°, denoting that the third slits 64a relatively slant to the first slits 62a.

The fourth region 65 is positioned between the second region 63 and the third region 64, and has a number of fourth slits 65a and a number of fourth opaque portions 65b. The fourth slits 65a are parallel to and alternate with the fourth opaque portions 65b. The fourth slits 65a are parallel to the third slits 64a, while the width of the fourth slits 65a and that of the third slits 64a are respectively slightly larger than the width of the third opaque portions 64b and that of the fourth opaque portions 65b.

The mask 60 moves over the amorphous silicon layer on the substrate for the laser to crystallize every row of the amorphous silicon layer to form poly-silicon via the mask 60. In the present embodiment, suppose the mask 60 scans the odd-numbered rows of the amorphous silicon layer along the direction 67a, the laser projecting region corresponding to the fourth slits 65a alternate and partially overlap with the crystallization regions corresponding to the third slits 64a. The laser projecting regions corresponding to the second slits 63a alternate and partially overlap with the crystallization regions corresponding to the first slits 62a.

In the present embodiment, the extending direction x5 of the first slits 62a is parallel to a direction 67a, so the second included angle between the extending direction x5 of the first slits 62a and the direction 67a is 0° or 180°. The extending direction s5 of the third slits 64a and the direction 67a have an included angle β5. In the present embodiment, the included angle β5 is smaller than 90° but larger than 0°. denoting that the extending direction s5 of the third slits 64a is slant to the direction 67a.

When the mask 60 scans the even-numbered rows of the amorphous silicon layer along the direction 67b, the laser projecting regions corresponding to the third slits 64a alternate and partially overlap with the crystallization regions corresponding to the fourth slits 65a. The laser projecting regions corresponding to the first slits 62a alternate and partially overlap with the crystallization regions corresponding to the second slits 63a.

When the mask 60 scans the amorphous silicon layer along the directions 67a and 67b respectively, the extending direction of the first slits 62a and that of the second slits 63a are parallel to the directions 67a and 67b, while the extending direction of the third slits 64a and that of the fourth slits 65a are relatively slant to the directions 67a and 67b.

Sixth Embodiment

Figure 16:
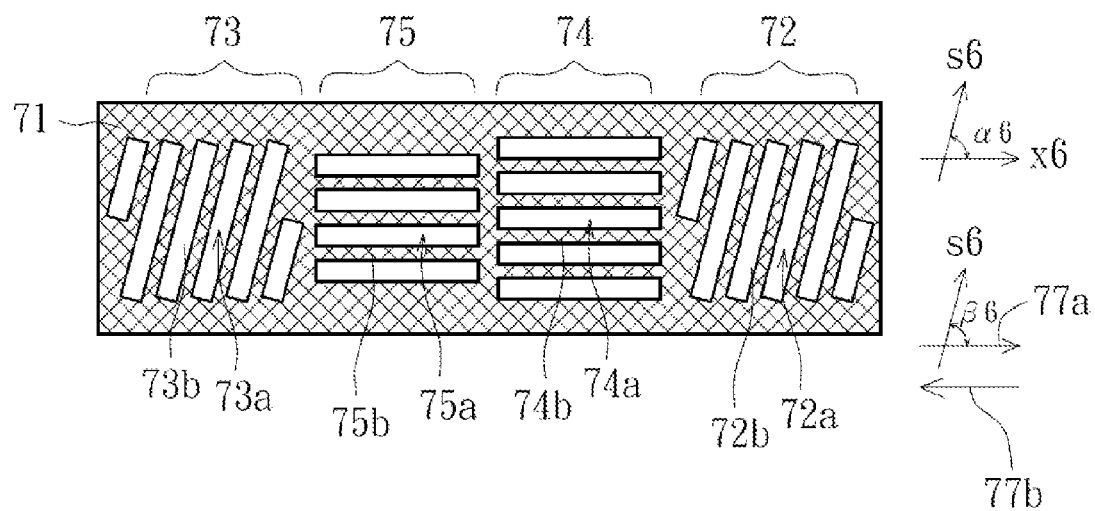
FIG. 16 is a diagram of a mask according to a sixth embodiment of the invention.

Referring to FIG. 16, a diagram of a mask according to a sixth embodiment of the invention is shown. In FIG. 16, a mask 70 includes a mask body 71, a first region 72, a second region 73, a third region 74 and a fourth region 75. The first region 72, the second region 73, the third region 74 and the fourth region 75 are formed in the mask body 71. The first region 72 has a number of first slits 72a and a number of first opaque portions 72b. The first slits 72a are parallel to and alternate with the first opaque portions 72b. The second region 73 has a number of second slits 73a and a number of second opaque portions 73b. The second slits 73a are parallel to and alternate with the second opaque portions 73b, while the second slits 73a are parallel to the first slits 72a. The first slits 72a and the second slits 73a respectively correspond to the second opaque portions 73b and the first opaque portions 72b. The width of the first slits 72a and that of the second slits 73a are respectively slightly larger than the width of the second opaque portions 73b and that of the first opaque portions 72b.

The third region 74 is positioned between the first region 72 and the second region 73, and has a number of third slits 74a and a number of third opaque portions 74b. The third slits 74a are parallel to and alternate with the third opaque portions 74b, while the third slits 74a are relatively slant to the first slits 72a.

The extending direction of the third slits 74a and that of the first slits 72a respectively are x6 and s6 with a first included angle α6 existing between x6 and s6. In the present embodiment, the first included angle α6 is smaller than 90° but larger than 0°, denoting that the third slits 74a are relatively slant to the first slits 72a.

The fourth region 75 is positioned between the second region 73 and the third region 74, and has a number of fourth slits 75a and a number of fourth opaque portions 75b. The fourth slits 75a are parallel to and alternate with the fourth opaque portions 75b. The fourth slits 75a are parallel to the third slits 74a. The width of the fourth slits 75a and that of the third slits 74a are respectively slightly larger than the width of the third opaque portions 74b and that of the fourth opaque portions 75b.

The mask 70 moves over the amorphous silicon layer on the substrate for the laser to crystallize every row of the amorphous silicon layer to form poly-silicon via the mask 30. In the present embodiment, suppose the mask 70 scans the odd-numbered rows of the amorphous silicon layer along the direction 77a, the laser projecting regions corresponding to the fourth slits 75a alternate and partially overlap with the crystallization regions corresponding to the third slits 74a. The laser projecting regions corresponding to the second slits 73a alternate and partially overlap with the crystallization regions corresponding to the first slits 72a.

The extending direction s6 of the first slits 72a and the direction 77a have a second included angle β6. In the present embodiment, the second included angle β6 is smaller than 90° but larger than 0°, denoting that the extending direction s6 of the first slits 72a is slant to the direction 77a.

When mask 70 scans the even-numbered rows of the amorphous silicon layer along the direction 77b, the laser projecting regions corresponding to the third slits 74a alternate and partially overlap with the crystallization regions corresponding to the fourth slits 75a. The laser projecting regions corresponding to the first slits 72a alternate and partially overlap with the crystallization regions corresponding to the second slits 73a.

When the mask 70 scans the amorphous silicon layer along the direction 77a and 77b respectively, the extending direction of the first slits 72a and that of the second slits 73a are relatively slant to the directions 77a and 77b, while the extending direction of the third slits 74a and that of the fourth slits 75a are parallel to the directions 77a and 77b.

A mask and a method of manufacturing a poly-silicon layer using the same are disclosed in above embodiments of the invention. Of the mask applied in sequential lateral solidification technology, the slits on the first and the last areas are designed to be mutually parallel and partially overlapping, while the slits on the middle two areas are designed to be mutually parallel and partially overlapping but mutually perpendicular to or relatively slant to an angle to the slits on the first and the last areas. Consequently, the sub-grain boundary of the poly-silicon crystallized on the amorphous silicon according to the sequential lateral solidification technology is reduced, the evenness along the crystallization direction of the poly-silicon is improved, the coarseness on the surface of the poly-silicon layer is reduced, and the electricity and evenness on the thin film transistor completed in subsequent manufacturing process is largely improved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A mask comprising:
   a first region having a plurality of first slits and a second region having a plurality of second slits respectively formed on two ends of the mask, wherein the first slits and the second slits are substantially parallel to each other and both extend towards a first direction; and
   a third region having a plurality of third slits and a fourth region having a plurality of fourth slits respectively formed between the first region and the second region wherein the third slits and the fourth slits are substantially parallel to each other and both extend towards a second direction, and the second direction is different from the first direction.

2. The mask according to claim 1, wherein the included angle between the first direction and the second direction is 90°.

3. The mask according to claim 1, wherein the included angle between the first direction and the second direction is larger than 0° but smaller than 90°.

4. The mask according to claim 1, further comprising a mask body, wherein the first region, the second region, the third region and the fourth region are formed in the mask body.

5. The mask according to claim 1, further comprising a first mask body and a second mask body, wherein the first region, the third region and the fourth region are formed in the first mask body, while the second region is formed in the second mask body.

6. The mask according to claim 1, further comprising a first mask body and a second mask body, wherein the first region are formed in the first mask body, while the second region, the third region and the fourth region are formed in the second mask body.

7. The mask according to claim 1, further comprising a first mask body and a second mask body, wherein the first region and the third region are formed in the first mask body, while the second region and the fourth region are formed in the second mask body.

8. The mask according to claim 1, further comprising a first mask body, a second mask body and a third mask body, wherein the first region and the third region are formed in the first mask body, while the second region and the fourth region are respectively formed in the second mask body and the third mask body.

9. The mask according to claim 1, further comprising a first mask body, a second mask body and the third mask body, wherein the first region and the second region are respectively formed in the first mask body and the third mask body, while the third region and the fourth region are formed in the second mask body.

10. The mask according to claim 1, further comprising a first mask body, a second mask body and the third mask body, wherein the first region and the third region are respectively formed in the first mask body and the second mask body, while the second region and the fourth region are formed in the third mask body.

11. The mask according to claim 1, further comprising a first mask body, a second mask body, a third mask body and a fourth mask body, wherein the first region, the second region, the third region and the fourth region are respectively formed in the first mask body, the second mask body, the third mask body and the fourth mask body.

12. A method of manufacturing a poly-silicon layer, comprising:
    forming an amorphous silicon layer on a substrate;
    providing a mask comprising a first region having a plurality of first slits, a second region having a plurality of second slits, a third region having a plurality of third slits and a fourth region having a plurality of fourth slits, wherein the first region and the second region are respectively formed on the two ends of the mask, while the third region and the fourth region are respectively formed between the first region and the second region, wherein the first slits and the second slits are substantially parallel to each other and both extend towards a first direction , while the third slits and the fourth slits are substantially parallel to each other and both extend towards a second direction and the second direction is different from the first direction; and providing a laser to project laser light onto the substrate via the mask.

13. The method according to claim 12, wherein when the mask moves along a third direction, the laser projecting regions corresponding to the fourth slits alternate and partially overlap with the crystallization regions corresponding to the third slits, while the laser projecting regions corresponding to the second slits alternate and partially overlap with the crystallization regions corresponding to the first slits.

14. The method according to claim 13, wherein the included angle between the first direction and the third direction is 90°.

15. The method according to claim 13, wherein the included angle between the first direction and the third direction is 180°.

16. The method according to claim 13, wherein the included angle between the first direction and the third direction is larger than 0° but smaller than 90°.

17. The method according to claim 12, wherein when the mask moves along a fourth direction, the laser projecting regions corresponding to the third slits alternate and partially overlap with the crystallization regions corresponding to the fourth slits, while the laser projecting regions corresponding to the first slits alternate and partially overlap with the crystallization regions corresponding to the second slits.

18. The method according to claim 17, wherein the included angle between the first direction and the fourth direction is 90°.

19. The method according to claim 17, wherein the included angle between the first direction and the fourth direction is 180°.

20. The method according to claim 17, wherein the included angle between the first direction and the fourth direction is larger than 0° but smaller than 90°.

21. The method according to claim 12, wherein the included angle between the first direction and the second direction is 90°.

22. The method according to claim 12, wherein the included angle between the first direction and the second direction is larger than 0° but smaller than 90°.

* * * * *